United States Patent
Lin et al.

(10) Patent No.: US 11,483,922 B2
(45) Date of Patent: Oct. 25, 2022

(54) MULTI-SOCKET PANEL DEVICE WITH ANTI-CROSSTALK STRUCTURE

(71) Applicant: Jyh Eng Technology Co., Ltd., New Taipei (TW)

(72) Inventors: Yen-Lin Lin, New Taipei (TW); Meng-Ju Lee, New Taipei (TW)

(73) Assignee: JYH ENG TECHNOLOGY CO., LTD., New Taipei (TW)

( * ) Notice: Subject to any disclaimer, the term of this patent is extended or adjusted under 35 U.S.C. 154(b) by 17 days.

(21) Appl. No.: 17/115,717

(22) Filed: Dec. 8, 2020

(65) Prior Publication Data

US 2022/0183139 A1 Jun. 9, 2022

(51) Int. Cl.
| | | |
|---|---|---|
| H01R 13/64 | (2006.01) | |
| H05K 1/02 | (2006.01) | |
| H01R 13/6461 | (2011.01) | |
| H01R 25/00 | (2006.01) | |
| H01R 12/58 | (2011.01) | |
| H01R 13/518 | (2006.01) | |

(52) U.S. Cl.
CPC ......... *H05K 1/024* (2013.01); *H01R 13/6461* (2013.01); *H01R 25/006* (2013.01); *H05K 1/0243* (2013.01); *H01R 12/58* (2013.01); *H01R 13/518* (2013.01); *H05K 2201/09063* (2013.01); *H05K 2201/10189* (2013.01)

(58) Field of Classification Search
CPC .. H05K 1/024; H05K 1/0243; H01R 13/6461; H01R 25/026
USPC .......................................................... 439/38
See application file for complete search history.

(56) References Cited

U.S. PATENT DOCUMENTS

| | | | | |
|---|---|---|---|---|
| 7,367,850 | B1* | 5/2008 | Chang ................... | H04Q 1/116 439/540.1 |
| 7,806,721 | B2* | 10/2010 | Herndon .............. | H01R 13/745 439/540.1 |
| 7,878,824 | B2* | 2/2011 | Pepe .................... | H01R 13/506 439/607.02 |
| 7,896,692 | B2* | 3/2011 | Gibson ................. | H05K 1/024 439/540.1 |
| 7,909,643 | B2* | 3/2011 | Pepe .................... | H01R 13/514 439/540.1 |
| 8,366,540 | B2* | 2/2013 | Yoshimi ................ | G07F 17/34 463/16 |
| 11,031,738 | B1* | 6/2021 | Lin ....................... | H01R 12/58 |
| 2008/0096438 | A1* | 4/2008 | Clark ................... | H01R 13/518 439/713 |
| 2010/0291795 | A1* | 11/2010 | Gibson ................ | H05K 1/0216 174/255 |

(Continued)

*Primary Examiner* — Alexander Gilman
(74) *Attorney, Agent, or Firm* — Chun-Ming Shih; HDLS IPR Services

(57) ABSTRACT

A multi-socket panel device with an anti-crosstalk structure, wherein a plurality of through holes are formed on the circuit board. The through holes are arranged in two rows extending from one side of the circuit board to another side of the circuit board. Two electrical connectors disposed on the circuit board are arranged near two opposite sides of the rows of the through holes. The electromagnetic wave propagating in the circuit board are reflected or refracted by the through holes due to travel in different media, whereby the crosstalk caused by the electromagnetic wave is avoided when signals of high frequency are transmitted in two electrical connectors.

12 Claims, 10 Drawing Sheets

(56) References Cited

U.S. PATENT DOCUMENTS

| | | | | |
|---|---|---|---|---|
| 2011/0217867 A1* | 9/2011 | Allwood | .............. | H01R 13/518 |
| | | | | 439/540.1 |
| 2012/0129380 A1* | 5/2012 | Donhauser | ........... | H01R 13/633 |
| | | | | 439/352 |
| 2013/0344733 A1* | 12/2013 | Mateo | ....................... | H04Q 1/13 |
| | | | | 439/540.1 |
| 2015/0364859 A1* | 12/2015 | Maranto | ............ | H01R 13/5812 |
| | | | | 439/469 |

\* cited by examiner

MULTI-SOCKET PANEL DEVICE WITH ANTI-CROSSTALK STRUCTURE

BACKGROUND OF THE INVENTION

Field of the Invention

The invention relates to a technical field of shielding structure for preventing crosstalk caused by signals of high frequency, and more particularly to a multi-socket panel device with an anti-crosstalk structure.

Description of the Related Art

According to international standards, there are two types of systems in the network system, the shielded system and the unshielded system. In the setting of the shielded system, there must be a shielding member for isolate external interference signals, and the interference signals can be led out through grounding. Therefore, there will be a grounding wire or braided net arranged in the network cable, and in the jumper, in addition to the ground wire or braided net in the wire, there will also be shielding members on the connectors at both ends of the wire, such as iron sheets connected to the grounding wire, and there will be a grounding wire on the panel, so that the grounding effect can be continuous when the jumper is inserted into the panel, thereby completing the shielding effect. On the contrary, in the non-shielded system, no shielding members are added to the network cables, jumpers, and panels.

As the progress of the times, the demand for network frequencies is getting higher and higher, so the international standards have also evolved to improve the aforementioned two systems. However, when the frequency is increased, the crosstalk is also relatively increased. Therefore, the self-generated crosstalk or external crosstalk must be effectively shielded.

In addition to the shielding structure provided between the terminals of the connector or the wires in the cable in order to obtain a better shielding effect, there will also be crosstalk interference problems between the terminals provided on the circuit board. In order to avoid crosstalk interference between the terminals provided on the circuit board, the number of electrical connectors allowed for each circuit board is reduced from six to two. In addition, U.S. Pat. No. 7,896,692 discloses a structure in which a slot is formed on a circuit board to shield crosstalk. However, it is easy to weaken the strength of the circuit board structure when the slot is formed on the circuit board, and the shielding effect thereof on crosstalk is limited.

BRIEF SUMMARY OF THE INVENTION

An object of the invention is to provide a multi-socket panel device with an anti-crosstalk structure, wherein a plurality of through holes are formed on the circuit board. The through holes are arranged in two rows extending from one side of the circuit board to another side of the circuit board. Two electrical connectors disposed on the circuit board are arranged on two opposite sides of the rows of the through holes. The electromagnetic wave propagating in the circuit board are reflected or refracted by the through holes due to travel in different media, whereby the crosstalk caused by the electromagnetic wave is avoided when signals of high frequency are transmitted in two electrical connectors.

The invention provides a multi-socket panel device with an anti-crosstalk structure. The multi-socket panel device in accordance with an exemplary embodiment of the invention includes a main base, a plurality of connector sets mounted to the main base, and a rear plate joined to the main base and covering the connector sets. Each of the connector sets includes a circuit board comprising a first surface, a second surface opposite to the first surface and a plurality of through holes extending from the first surface to the second surface, wherein the through holes are arranged in multiple rows along a predetermined trajectory, and o the through holes in two adjacent the rows are alternately arranged; a first electrical connector disposed on the first surface and including a first main body and a plurality of first terminals disposed in the first main body and connected to the first surface; a second electrical connector disposed on the first surface and including a second main body and a plurality of second terminals disposed in the second main body and connected to the first surface, wherein the first electrical connector and the second electrical connector are disposed on two opposite sides of the rows of the through holes; a plurality of first prick type terminals disposed on the second surface, penetrating the circuit board to the first surface and electrically connected to the first terminals; and a plurality of second prick type terminals disposed on the second surface, penetrating the circuit board to the first surface and electrically connected to the second terminals, wherein the first prick type terminals and the second prick type terminals are disposed on two opposite sides of the rows of the through holes.

The multi-socket panel device with an anti-crosstalk structure of the present invention includes a circuit board on which two rows of through holes are formed. The through holes in two adjacent rows are alternately arranged. Two electrical connectors are disposed on two opposite sides of the rows of the through holes. When signals of high frequency are transmitted in the electrical connectors, the electromagnetic wave generated by the signal of high frequency travels in two different media due to the existence of the through holes. As the traveling speeds in the circuit board and the air (the different media) are different, the electromagnetic wave is reflected or refracted by the wall of the through hole (an interface of two media), whereby the traveling course of the electromagnetic wave is deflected. Therefore, the crosstalk interference between the two electrical connectors is prevented.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
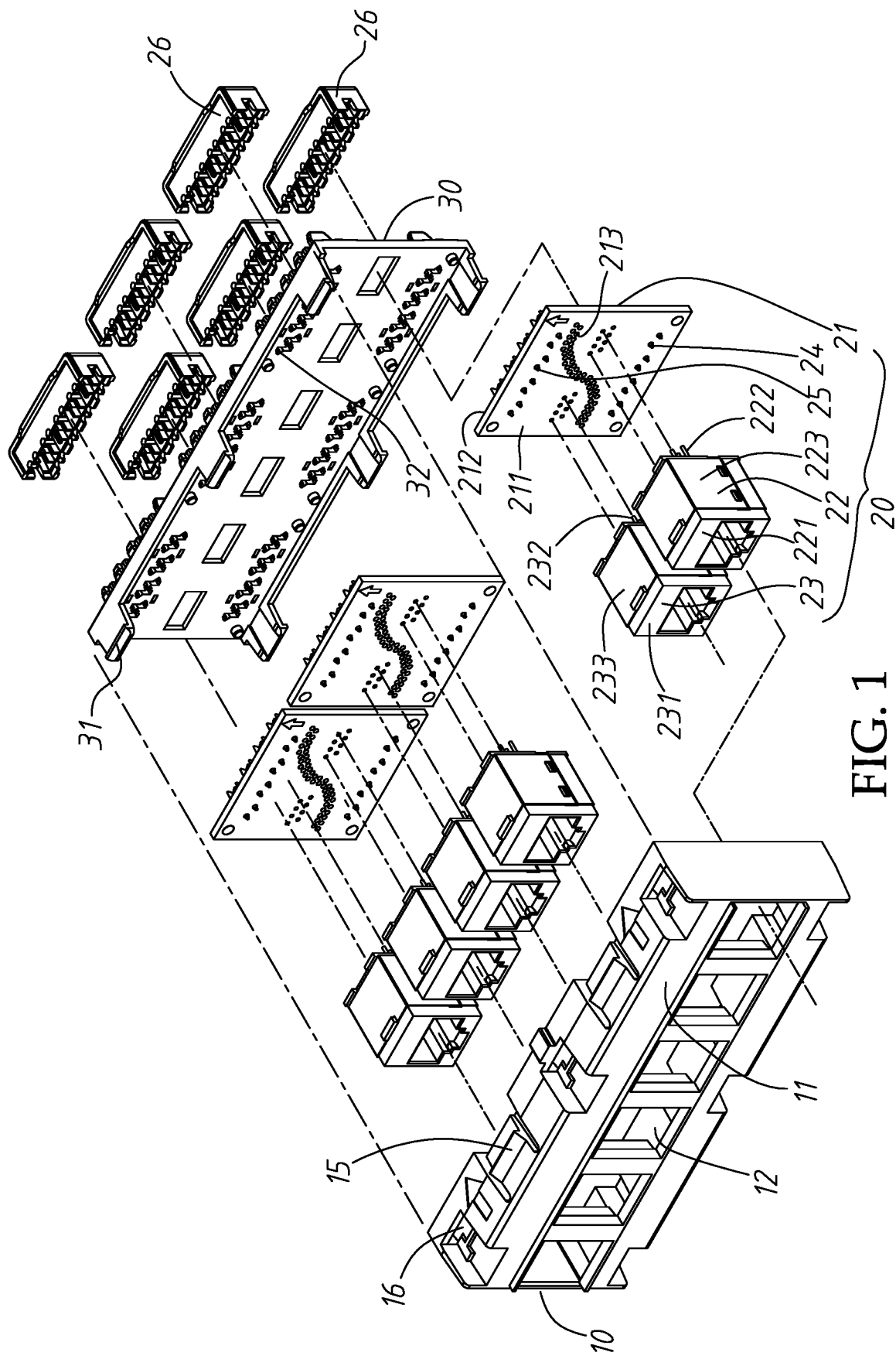
FIG. 1 is an perspective exploded view of an embodiment of a multi-socket panel device with an anti-crosstalk structure of the present invention.

Referring to FIGS. 1, 2, 3 and 4, an embodiment of a multi-socket panel device with an anti-crosstalk structure of the present invention includes a main base 10, a plurality of connector sets and a rear plate 30. The connector sets are mounted to the main base 10. As shown in FIG. 1, the main base 10 has an accommodating space and a plurality of slots 12 formed on a front surface 11. The connector sets 20 are exposed out of the main base 10 through the slots 12.

Figure 3:
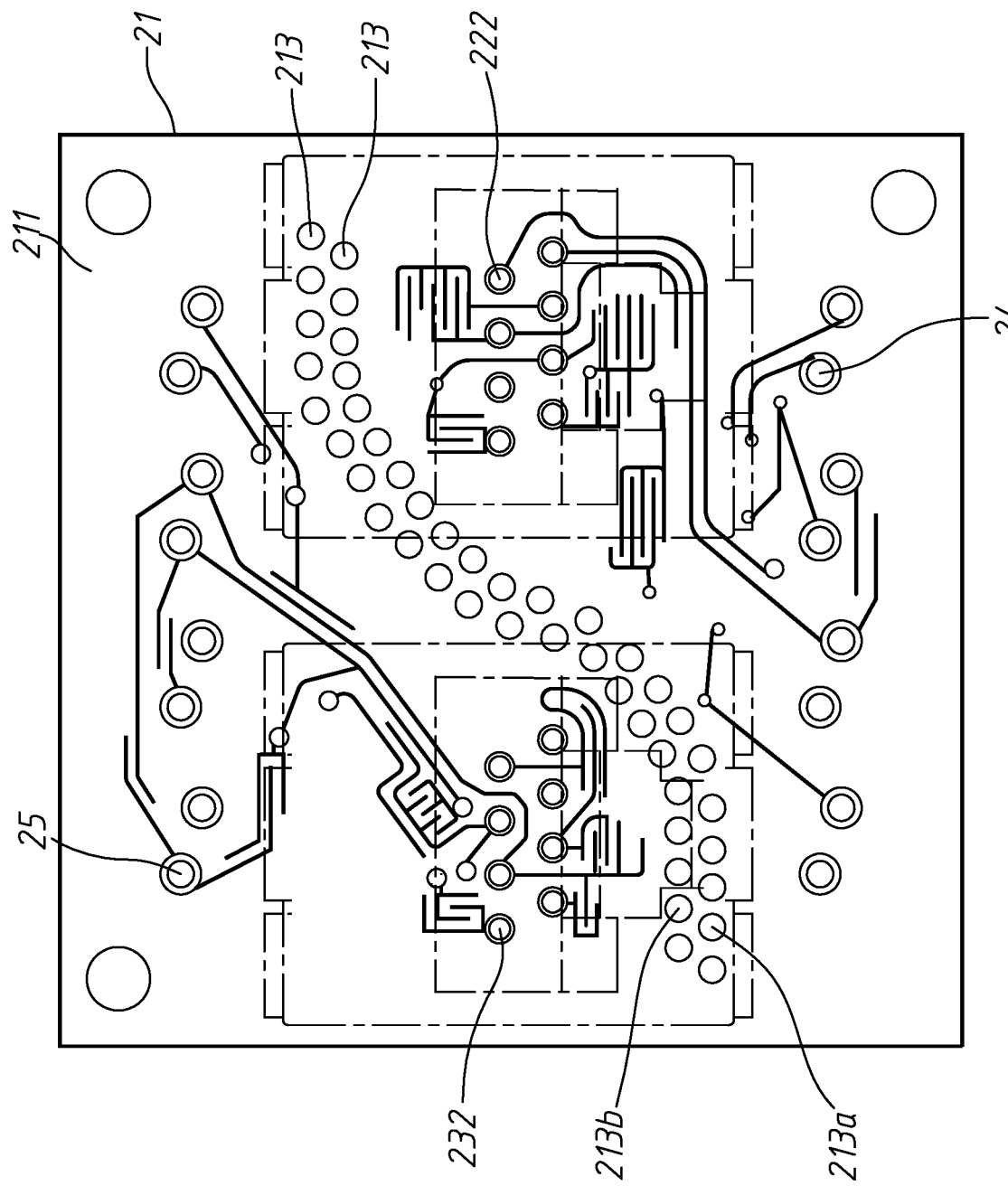
FIG. 3 is a schematic view of a circuit board of an embodiment of a multi-socket panel device with an anti-crosstalk structure of the present invention.
Figure 4:
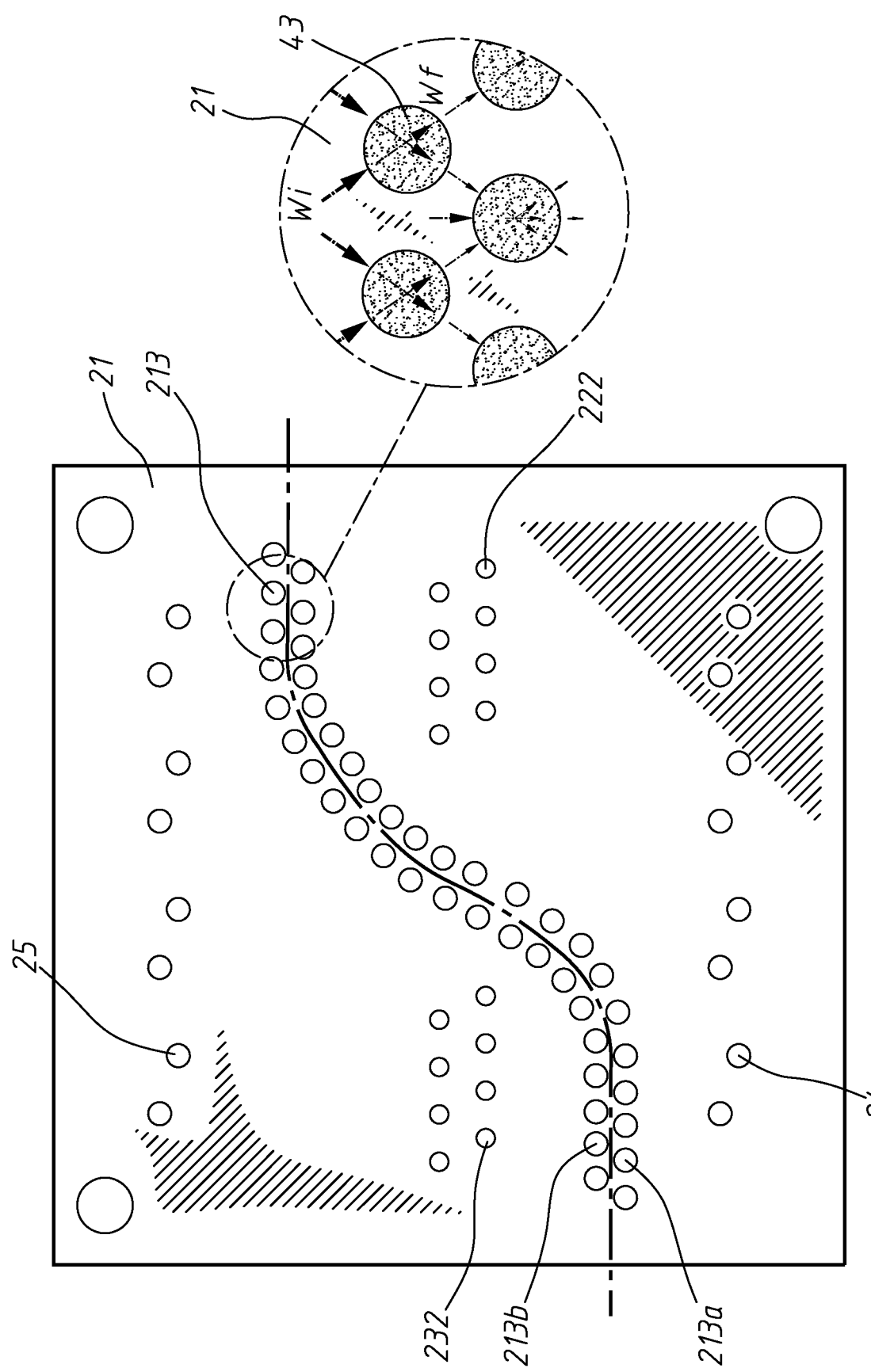
FIG. 4 is a schematic view of terminals and through holes on the circuit board of an embodiment of a multi-socket panel device with an anti-crosstalk structure of the present invention.

The connector set 20 includes a circuit board 21, a first electrical connector 22, a second electrical connector 23, a plurality of first prick type terminals 24 and a plurality of second prick type terminals 25. As shown in FIG. 1, the circuit board 21 includes a first surface 211, a second surface 212 opposite to the first surface 211 and a plurality of through holes 213 extending from the first surface 211 to the second surface 212, wherein the through holes 213 are arranged in multiple rows along a predetermined trajectory. In this embodiment, the through holes 213 are arranged in two rows along an S-shaped trajectory. As shown in FIGS. 3 and 4, the through hole 213a in one row and the through hole 213b in an adjacent row are alternately arranged. In another embodiment, the through holes 213 are arranged in two rows along a linear trajectory. In yet another embodiment, the through holes are arranged in two rows along a combination of a curved trajectory and a linear trajectory. The combination of the curved trajectory and a linear trajectory may include two trajectories, and one of the trajectories is curved, whereas the other trajectory is linear.

Figure 2:
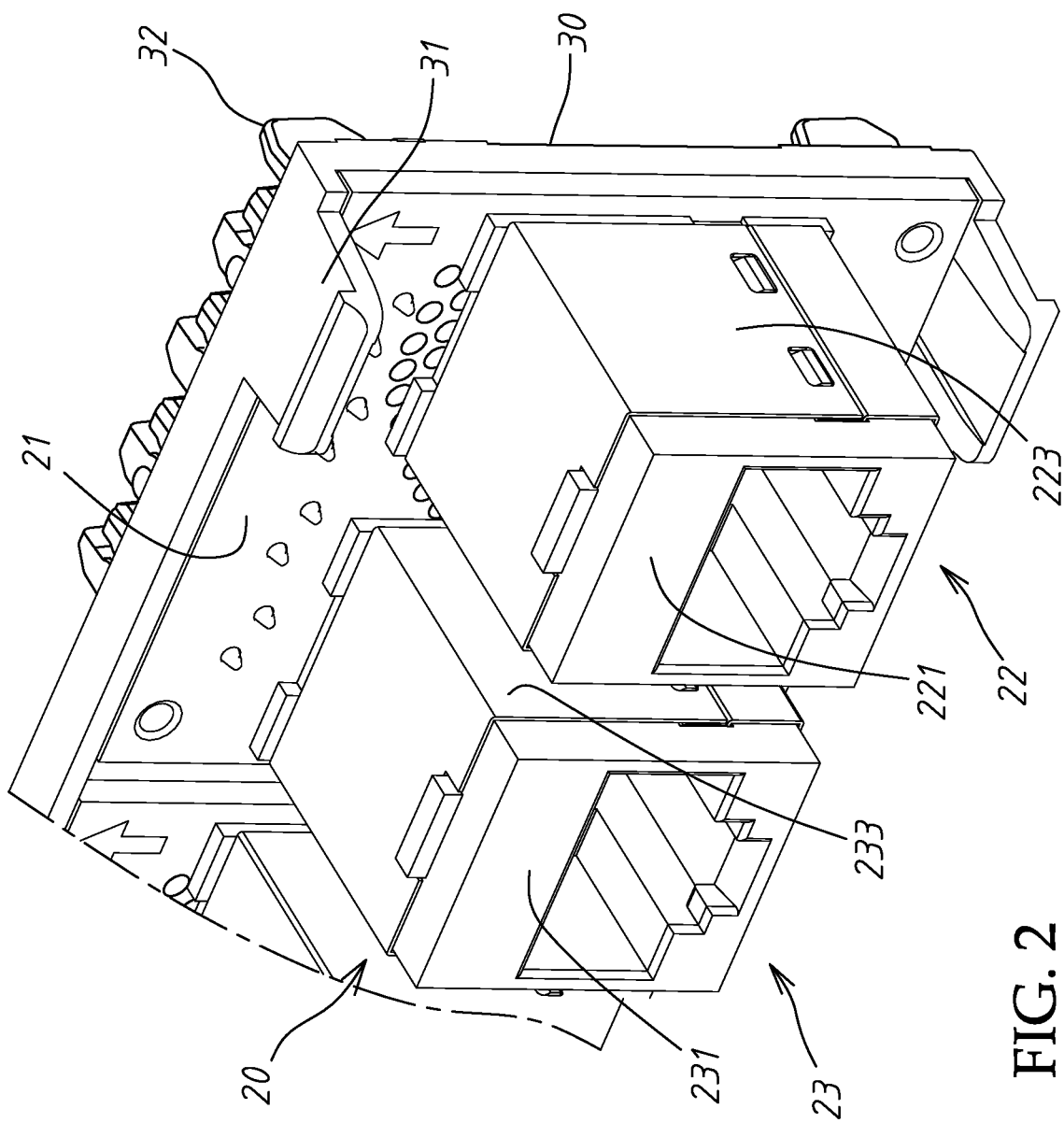
FIG. 2 is a partial perspective view of an embodiment of a multi-socket panel device with an anti-crosstalk structure of the present invention.

As shown in FIGS. 1 and 2, the first electrical connector 22 is disposed on the first surface 211 and includes a first main body 221, a plurality of first terminals 222 and a first shielding member 223. The first terminals 222 are disposed in the first main body 221 and connected to the first surface 211 of the circuit board 21. The first shielding member 223 covers the first main body 221. The second electrical connector 23 is disposed on the first surface 211 and includes a second main body 231, a plurality of second terminals 232 and a second shielding member 233. The second terminals 232 are disposed in the second main body 231 and connected to the first surface 211 of the circuit board 21. The second shielding member 233 covers the second main body 231. The first shielding member 223 and the second shielding member 233 are formed by folding a metal plate to be a rectangular collar. Moreover, the first electrical connector 22 and the second electrical connector 23 are socket connector. As shown in FIGS. 3 and 4, the first terminals 222 and the second terminals 232 are arranged near two opposite sides of the rows of the through holes 213 respectively. That is the first terminals 222 and the second terminals 232 are separated by the rows of the through holes 213.

As shown in FIGS. 1 and 2, the first prick type terminals 24 are disposed on the second surface 212 and penetrate the circuit board 21 to the first surface 211. As shown in FIGS. 3 and 4, the first prick type terminals 24 are electrically connected to the first terminals 222. The second prick type terminals 25 are disposed on the second surface 212 and penetrates the circuit board 21 to the first surface 211. As shown in FIGS. 3 and 4, the second prick type terminals 25 are electrically connected to the second terminals 232. The first prick type terminals 24 and the second prick type terminals 25 are disposed near two opposite sides of the rows of the through holes 213 respectively. That is the first prick type terminals 24 and the second prick type terminals 25 are by the rows of the through holes 213. As shown in FIGS. 3 and 4, the first terminals 24 and the second terminals 25 are disposed between the first prick type terminals 24 and the second prick type terminals 25.

As shown in FIGS. 1 and 2, the rear plate 30 is joined to the main base 10 and covers the connector sets 20. In this embodiment, the rear plate 30 has a plurality of engaging plates 31, and the main base 10 has a plurality of engaging grooves 16. The rear plate 30 is joined to the main base 10 through engagement of the engaging plates 30 to the engaging grooves 16. The rear plate 30 includes a plurality of connecting grooves 32 correspondingly connecting the first prick type terminals 24 and the second prick type terminals 25. Each of the connector 20 includes a plurality of protective covers 26 covering the connecting grooves 32.

Figure 5:
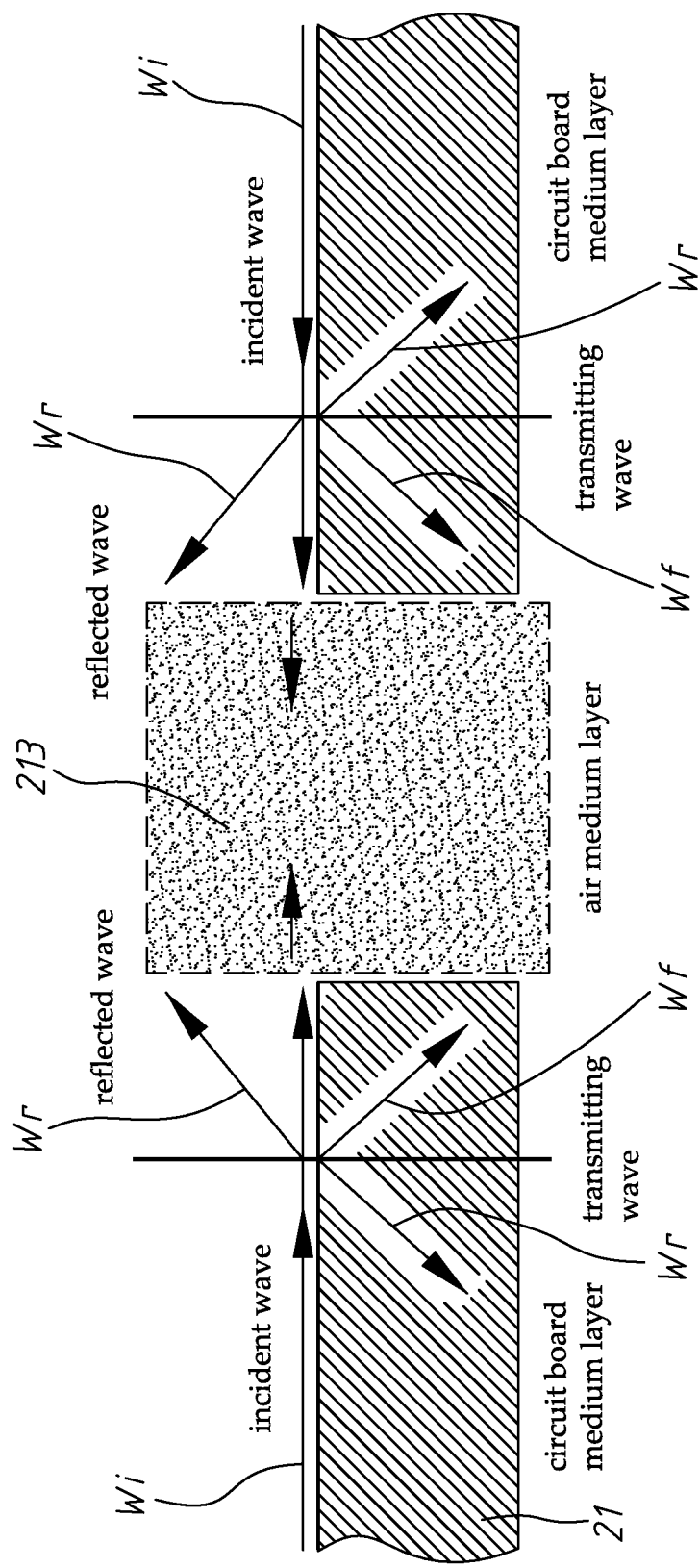
FIG. 5 depicts electromagnetic wave traveling in the circuit board having through holes.

As shown in FIGS. 4 and 5, the through holes 213 may have shield effects on the first terminals 222 and the second terminals 232 or on the first prick type terminals 24 and the second prick type terminals 25. Because the propagation of electromagnetic waves in the air of the through hole 213 is different from that in the circuit board 21 made of glass fiber. The dielectric constant of air is 1, which will be more effective than the glass fiber of the circuit board 21 to block or reduce the charge stored in the circuit board 21 and on the surface of the circuit board 21, and reduce the mutual interference of the charge carried on adjacent conductors. Multiple rows of through holes 213 are arranged in an alternate manner to block the uneven charge of the circuit board material with a dielectric constant, reflect and conduct electromagnetic waves to increase air barrier and reduce interference from adjacent conductors, thereby solving external crosstalk. The circuit board 21 of the present invention is provided with multiple rows of through holes 213. When the electromagnetic waves are transmitted on the circuit board 21, since the electromagnetic waves have different propagation speeds in the glass fiber material of the circuit board 21 and in the air in the through holes 213, when the incident wave Wi of the electromagnetic waves enters the interface between the circuit board 21 and the through hole 213, a reflected wave Wr and a transmitting wave Wf are generated. The transmitting wave Wf is refracted due to the different propagation speeds of electromagnetic waves in the air of the through hole 213 and in the circuit board 21, thereby achieving the effect of blocking interference between adjacent transmissions.

Figure 6:
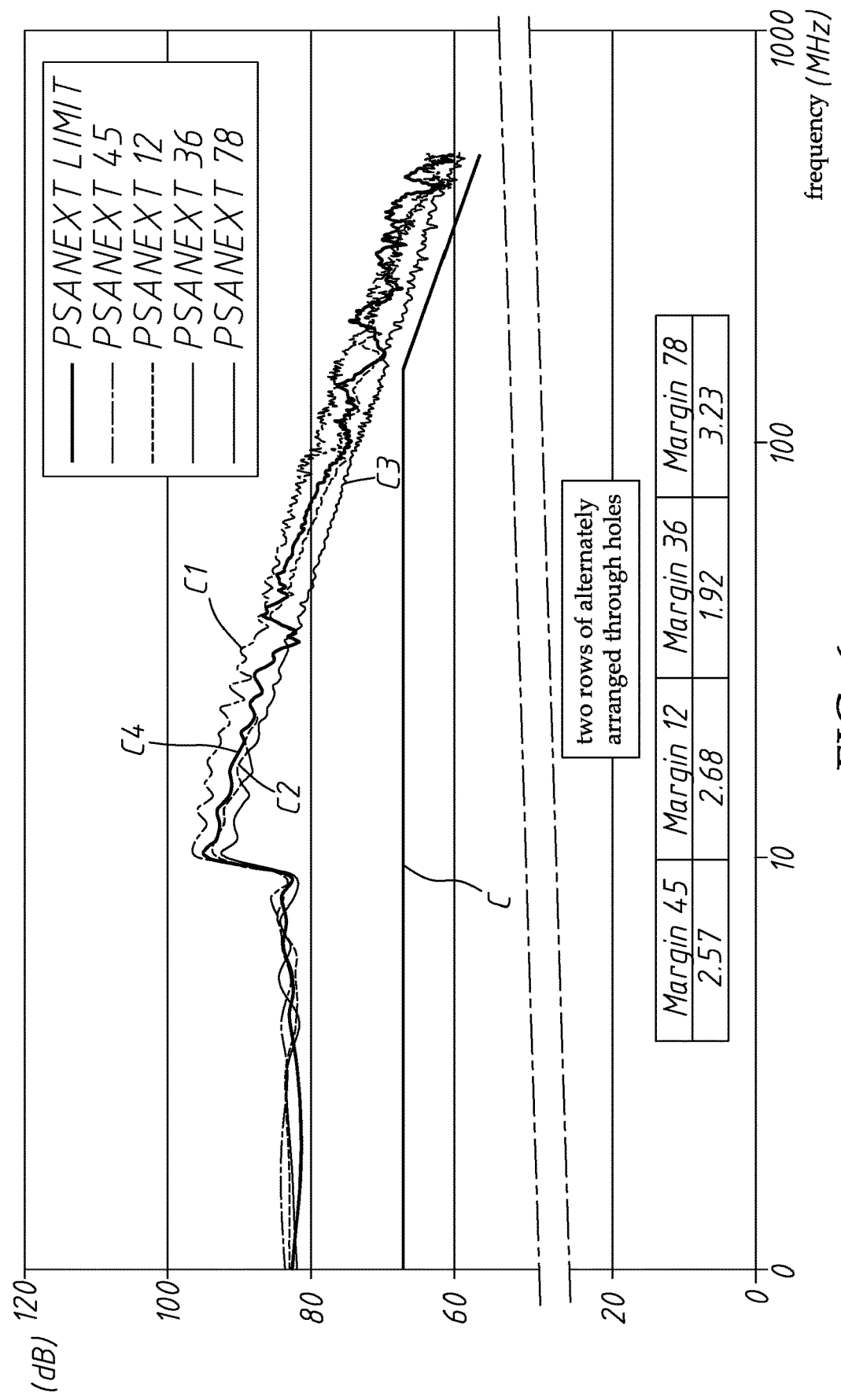
FIG. 6 is a overall data diagram of PSANEXT of an embodiment of a multi-socket panel device with an anti-crosstalk structure of the present invention.
Figure 7:
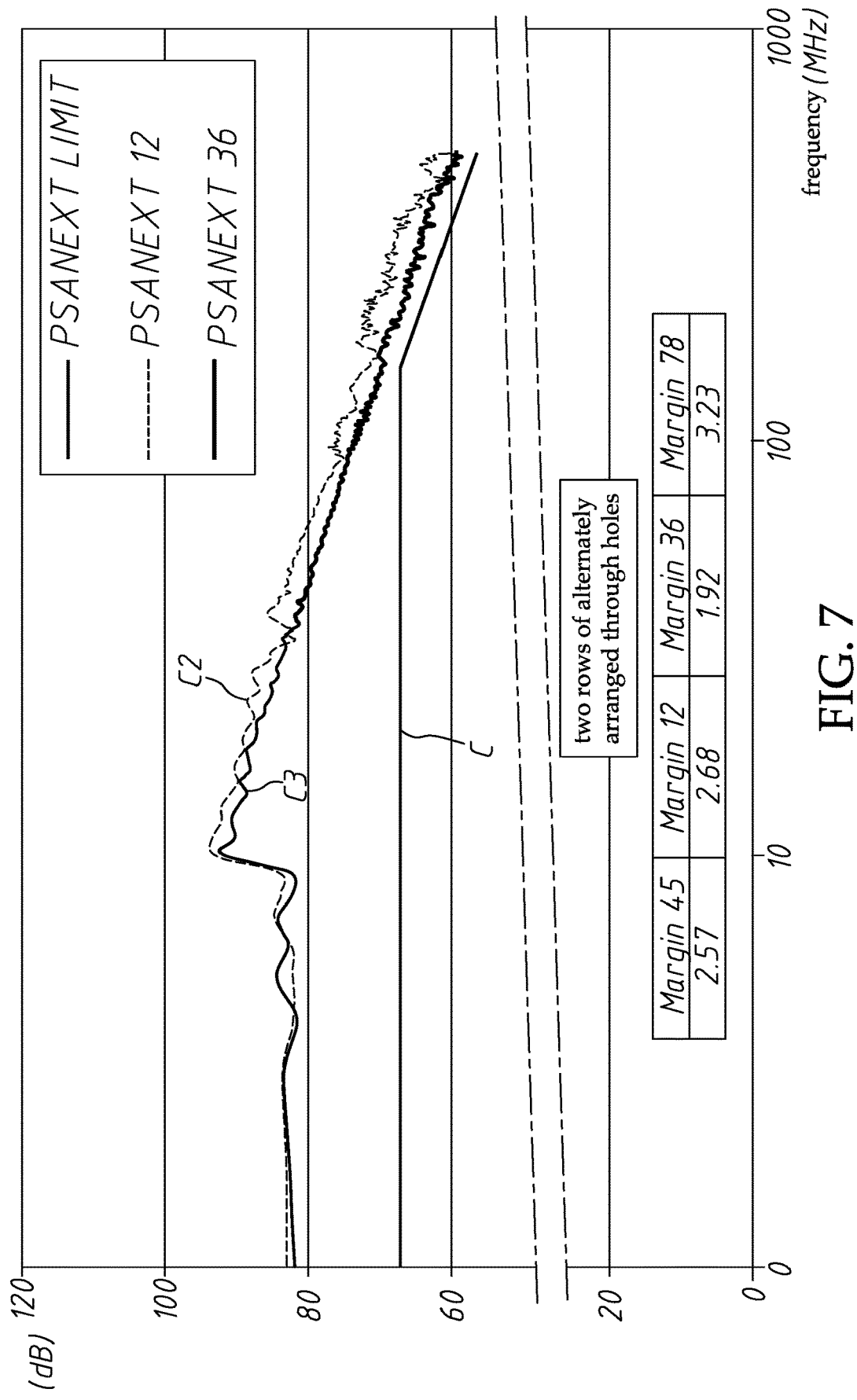
FIGS. 7 to 9 are divisional data diagram of PSANEXT of an embodiment of a multi-socket panel device with an anti-crosstalk structure of the present invention.
Figure 8:
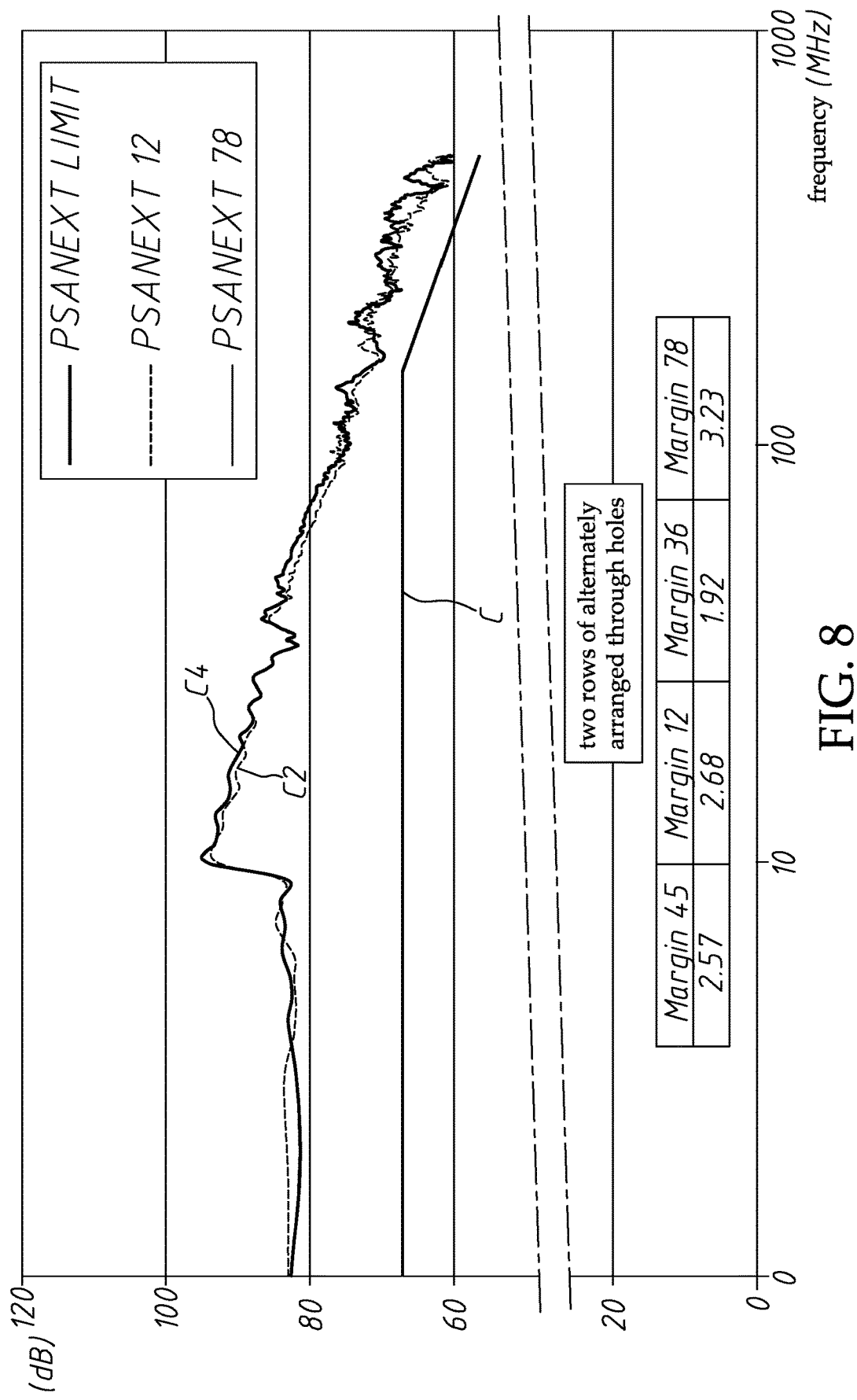
Figure 9:
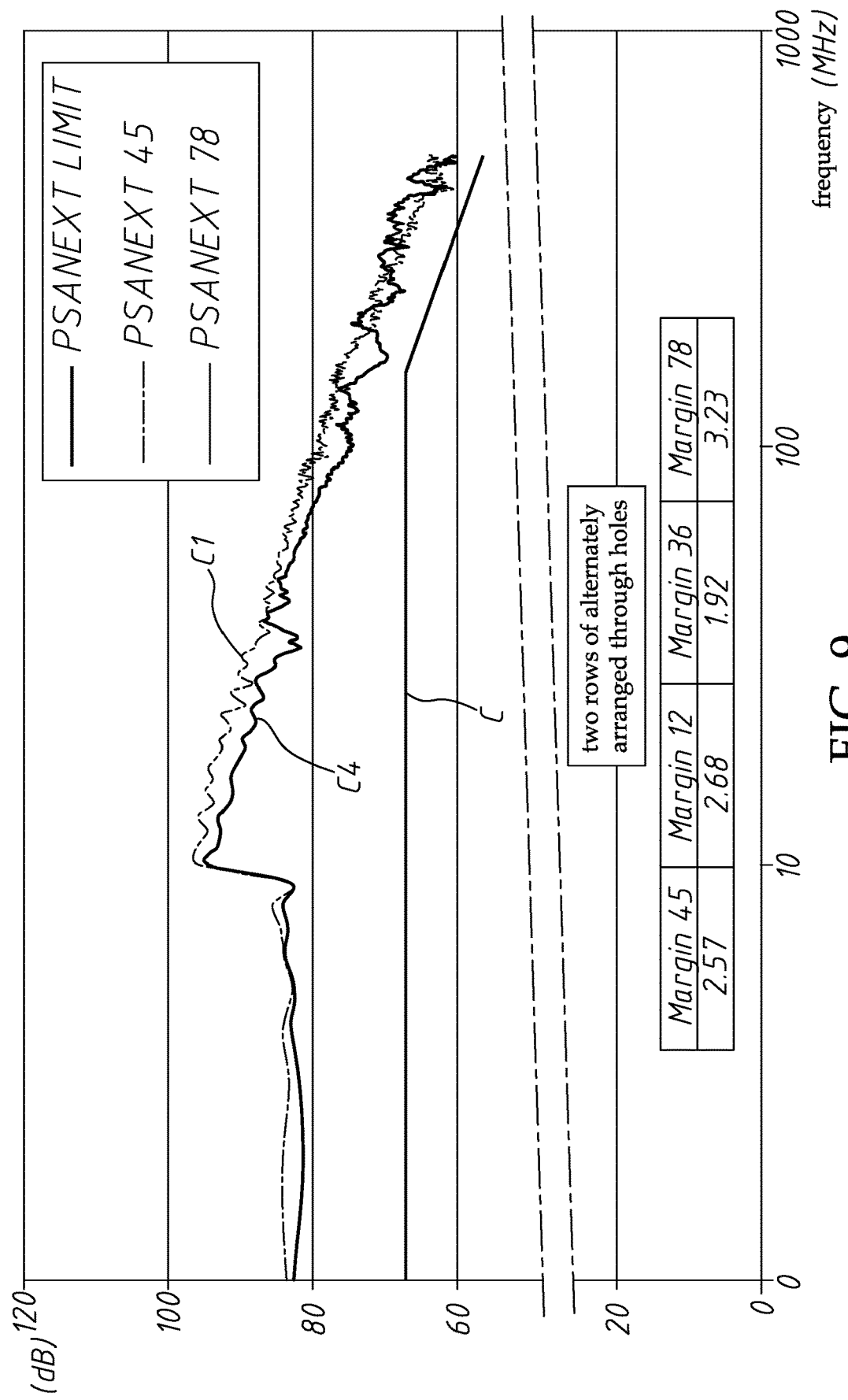

FIG. 6 shows the overall data of the PSANEXT test of the multi-socket panel device with the anti-crosstalk structure of the present invention. Among them, curve C1 represents the crosstalk value versus frequency of wire pair 45, curve C2 represents the crosstalk value versus frequency of wire pair 12, curve C3 represents the crosstalk value versus frequency of wire pair 36, and curve C4 represents the crosstalk value versus frequency of wire pair 78. The curve C represents the standard value of the crosstalk. It can be seen from FIG. 6 that the curve C3 which represents the worst effect is still higher than the curve C representing the standard value. FIGS. 7, 8 and 9 are the divisional data of the PSANEXT test of the multi-socket panel device with anti-crosstalk shielding structure of the present invention.

Therefore, it can be seen from the test results in FIGS. 6 to 9 that the multi-socket panel device with anti-crosstalk structure provided with a circuit board having through holes can indeed produce an excellent effect of preventing crosstalk interference.

Figure 10:
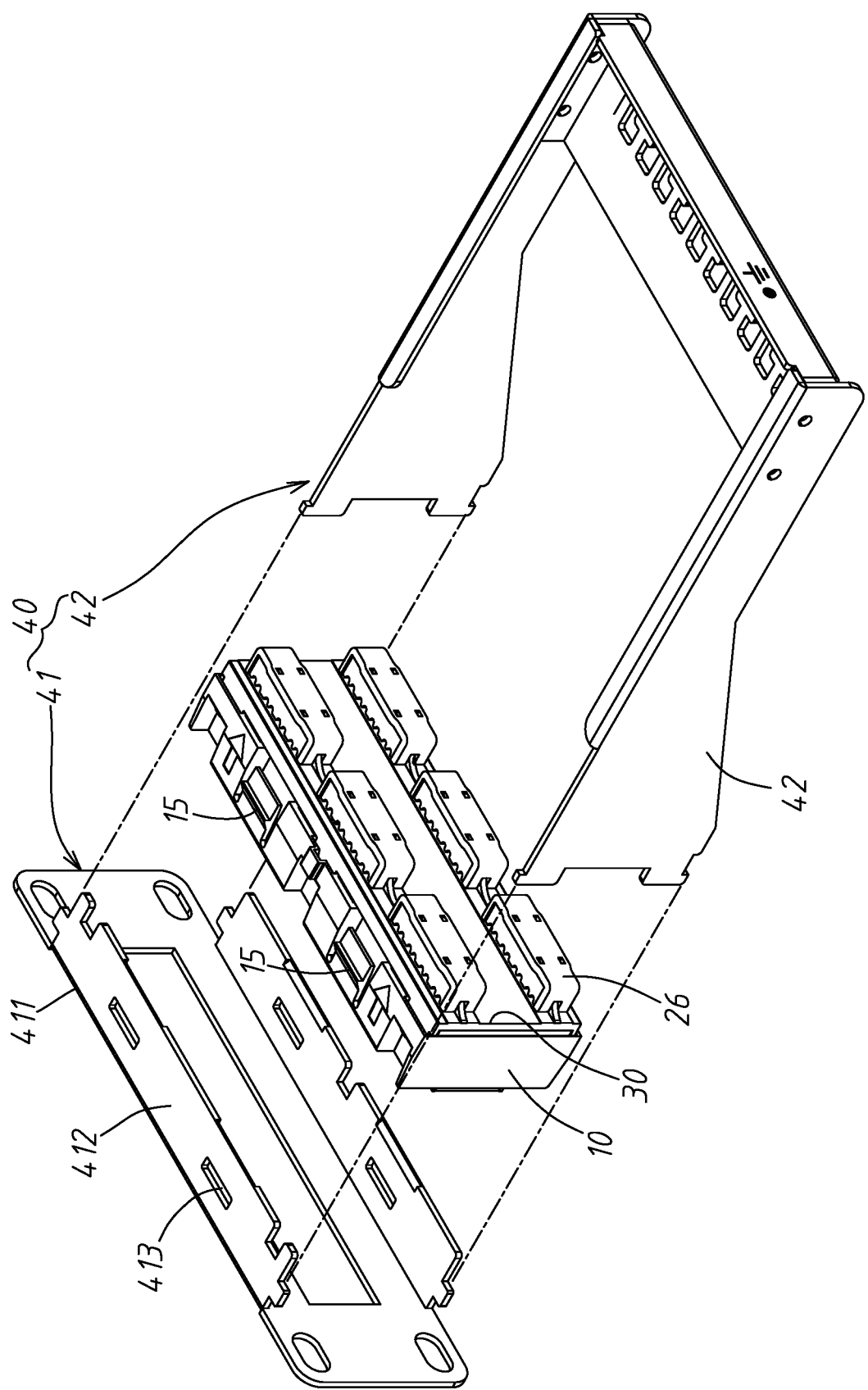
FIG. 10 is a partial exploded perspective view of another embodiment of a multi-socket panel device with an anti-crosstalk structure of the present invention.

FIG. 10 is another embodiment of the multi-socket panel device with anti-crosstalk structure of the present invention. In the present embodiment, the multi-socket panel device with anti-crosstalk structure further includes a panel set 40 configured to secure the main base 10, the connector sets 20 and the rear plate 30. The panel set 40 includes a front seat 41 and a frame 42 engaging the front seat 41. The front seat 41 has a front seat main body 411 and two lateral plates 412 extending from the front seat main body 411. The main base 10 is sandwiched between the lateral plates 412, and the frame 42 engages the front seat main body 411. The top and bottom ends of the main base 10 are respectively provided with fasteners 15 which are engaged with the engaging holes 413 on the lateral plate 412, whereby the main base 10 is engaged with the lateral plate 412, and the frame 42 is engaged with the front seat 41.

The multi-socket panel device with an anti-crosstalk structure of the present invention includes a circuit board on which two rows of through holes are formed. The through holes in two adjacent rows are alternately arranged. Two electrical connectors are disposed on two opposite sides of the rows of the through holes. When signals of high frequency are transmitted in the electrical connectors, the electromagnetic wave generated by the signal of high frequency travels in two different media due to the existence of the through holes. As the traveling speeds in the circuit board and the air (the different media) are different, the electromagnetic wave is reflected or refracted by the wall of the through hole (an interface of two media), whereby the traveling course of the electromagnetic wave is deflected. Therefore, the crosstalk interference between the two electrical connectors is prevented.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-socket panel device with an anti-crosstalk structure, comprising:
    a main base;
    a plurality of connector sets mounted to the main base, each of the connector sets comprises:
    a circuit board comprising a first surface, a second surface opposite to the first surface and a plurality of through holes extending from the first surface to the second surface, wherein the through holes are arranged in two rows along a predetermined trajectory, the two rows are disposed at opposite sides of the predetermined trajectory, respectively, and the through holes in the two rows are alternately arranged at asymmetrical positions at the opposite sides of the predetermined trajectory;
    a first electrical connector disposed on the first surface and comprising a first main body and a plurality of first terminals disposed in the first main body and connected to the first surface;
    a second electrical connector disposed on the first surface and comprising a second main body and a plurality of second terminals disposed in the second main body and connected to the first surface, wherein the first electrical connector and the second electrical connector are disposed near two opposite sides of the rows of the through holes respectively;
    a plurality of first prick type terminals disposed on the second surface, penetrating the circuit board to the first surface and electrically connected to the first terminals;
    a plurality of second prick type terminals disposed on the second surface, penetrating the circuit board to the first surface and electrically connected to the second terminals, wherein the first prick type terminals and the second prick type terminals are disposed near two opposite sides of the rows of the through holes respectively; and
    a rear plate joined to the main base and covering the connector sets,
    wherein respective first terminals are connected to a plurality first conductive points on the circuit board located at one of the opposite sides of the predetermined trajectory, respective second terminals are connected to a plurality second conductive points on the circuit board located at another of the opposite sides of the predetermined trajectory, and the two rows are disposed between the first terminals and the second terminals.

2. The multi-socket panel device as claimed in claim 1, wherein the predetermined trajectory is a curved trajectory from one side of the circuit board to another side of the circuit board.

3. The multi-socket panel device as claimed in claim 1, wherein the predetermined trajectory is a linear trajectory from one side of the circuit board to another side of the circuit board.

4. The multi-socket panel device as claimed in claim 3, wherein the first terminals and the second terminals are disposed between the first prick type terminals and the second prick type terminals.

5. The multi-socket panel device as claimed in claim 1, wherein the predetermined trajectory is a combination of a linear trajectory and a curved trajectory from one side of the circuit board to another side of the circuit board.

6. The multi-socket panel device as claimed in claim 1, wherein the rear plate comprises a plurality of connecting grooves correspondingly connecting the first prick type terminals and the second prick type terminals.

7. The multi-socket panel device as claimed in claim 6, further comprising a plurality of protective covers covering the connecting grooves.

8. The multi-socket panel device as claimed in claim 1, wherein the first electrical connector comprises a first shielding member covering the first main body, the second electrical connector comprises a second shielding member covering the second main body, and the first shielding member and the second shielding member are formed by folding a metal plate to be a rectangular collar.

9. The multi-socket panel device as claimed in claim 1, wherein the first electrical connector and the second electrical connector are socket connector.

10. The multi-socket panel device as claimed in claim 1, wherein the main base has an accommodating space where the connector sets are disposed, and the main base has a plurality of slots through which the connector sets are exposed.

11. The multi-socket panel device as claimed in claim 1, wherein the rear plate has a plurality of engaging plates, the main base has a plurality of engaging grooves, and the rear plate is joined to the main base through engagement of the engaging plates to the engaging grooves.

12. The multi-socket panel device as claimed in claim 1, further comprising a panel set configured to secure the main base, the connector sets and the rear plate, wherein the panel set comprises a front seat and a frame engaging the front seat, the front seat has a front seat main body and two lateral plates extending from the front seat main body, the main base is sandwiched between the lateral plates, and the frame engages the front seat main body.

\* \* \* \* \*